(12) United States Patent
Liu

(10) Patent No.: US 7,190,040 B2
(45) Date of Patent: Mar. 13, 2007

(54) SEMICONDUCTOR DEVICE AND METHOD OF MANUFACTURING SAME

(75) Inventor: Guo-lin Liu, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 150 days.

(21) Appl. No.: 10/918,485

(22) Filed: Aug. 16, 2004

(65) Prior Publication Data

US 2005/0156270 A1 Jul. 21, 2005

(30) Foreign Application Priority Data

Jan. 19, 2004 (JP) .............................. 2004/010523

(51) Int. Cl.
*H01L 29/00* (2006.01)
(52) U.S. Cl. .................................... 257/499
(58) Field of Classification Search ............... 438/162, 438/149, 3; 257/499
See application file for complete search history.

(56) References Cited

U.S. PATENT DOCUMENTS 4,523,963 A * 6/1985 Ohta et al. .................. 438/162
4,983,251 A * 1/1991 Haisma et al. ................. 438/3
6,228,691 B1 * 5/2001 Doyle ......................... 438/149
6,399,429 B1 6/2002 Yamoto et al.

FOREIGN PATENT DOCUMENTS

| JP | 05-326692 | 12/1993 |
| JP | 2000-021790 | 1/2000 |
| JP | 2000-223419 | 8/2000 |

\* cited by examiner

*Primary Examiner*—Carl Whitehead, Jr.
*Assistant Examiner*—Monica D. Harrison
(74) *Attorney, Agent, or Firm*—Rabin & Berdo, PC

(57) ABSTRACT

The present invention provides a semiconductor device which do not form parasitic transistors in device isolation regions and is capable of narrowing device-to-device intervals, and a method of manufacturing the semiconductor device. The method includes a step for anisotropically etching spots that serve as active regions of a sapphire substrate and causing their ends to become substantially normal to the surface of the sapphire substrate, a step for forming a silicon layer so as to be thicker than an etching depth, a step for implanting silicon ions to amorphize the silicon layer, a step for performing annealing and thereby recrystallizing the amorphized silicon layer, and a step for planarizing the recrystallized silicon layer until the sapphire substrate is exposed, thereby to leave the silicon layer that serves as each of the active regions, whereby device-to-device isolation regions can be formed normal to the sapphire substrate.

6 Claims, 4 Drawing Sheets

SEMICONDUCTOR DEVICE AND METHOD OF MANUFACTURING SAME

BACKGROUND OF THE INVENTION

1. Field of the Invention

The present invention relates to a semiconductor device, and particularly to a semiconductor device using a sapphire substrate used as an insulated board, wherein the sapphire substrate per se serves as device-to-device isolation regions, and a method of manufacturing the semiconductor device.

2. Description of the Related Art

Attention has heretofore been focused on a semiconductor device having an SOI (Silicon On Insulator) structure excellent in high-speed operability. Although several SOI structures have been put to practical use, a semiconductor device using a sapphire substrate is also one of them.

In a method of manufacturing the semiconductor device using the sapphire substrate, a silicon (Si) layer is first epitaxially grown on the sapphire ($Al_2O_3$) substrate. Next, $Si^+$ ions are implanted therein to amorphize the silicon layer once, which in turn is monocrystallized again to thereby form a good-quality Si layer less reduced in crystal defect, whereby an SOS (Silicon On Sapphire) substrate ca be formed. Thereafter, a semiconductor device element is formed on the Si layer by using a normal semiconductor process.

A patent document (Japanese Unexamined Patent Publication No. Hei 5(1993)-326692) discloses a method of etching active regions of a silicon substrate, implanting oxygen ions to form an embedded oxide film and grinding the surface of the silicon substrate to thereby obtain silicon layers corresponding to the active regions, each having a uniform thickness.

A method has been described in a patent document (Japanese Unexamined Patent Publication No. 2000-21790), which in order to uniformly form a silicon layer on an insulated board at a low temperature, seeds a sapphire film to thereby precipitate silicon out of a low melting-point metal layer obtained by melting polysilicon or amorphous silicon. A method of seeding a sapphire film to thereby deposit silicon by a catalytic CVD method has been disclosed in a patent document (Japanese Unexamined Patent Publication No. 2000-223419).

When a semiconductor elemental device having an SOI structure is manufactured, a LOCOS (Local Oxidation Of Silicon) method is generally used in most cases as a method of isolating between respective devices or elements. A schematic cross-section of a conventional semiconductor device using a LOCOS method is shown in FIG. 4. Silicon layers 2, which serve as device regions, are formed on a sapphire substrate 1. A gate oxide film 4 of a field effect transistor, a gate 5 thereof and contacts 6 for its source and drain are formed over the silicon layer 2. Then, the elements (silicon layers 2) adjacent to one another are respectively separated by LOCOS oxide films 3.

SUMMARY OF THE INVENTION

When, however, the LOCOS method is used to isolate between the elements of the semiconductor elemental device having the SOI structure, the LOCOS oxide films 3 have shapes pointed in a bird's beak fashion at portions brought into contact with the silicon layers 2 and hence parasitic transistors are formed thereat. Each of the parasitic transistors increases the possibility that degradation of hump (increase in leak current) characteristics will take place with respect to device's basic characteristics. A problem also arises in that the bird's beak shape of each device isolation region leads to a restricted item and hence a device-to-device interval cannot be narrowed, thus causing a difficulty in device's miniaturization.

Therefore, the present invention has been made in view of such problems. An object of the present invention is to provide a novel and improved semiconductor device which is capable of improving a structure of a device isolation region and its shape, avoiding the occurrence of a parasitic transistor in the device isolation region, and narrowing a device-to-device interval, and a method of manufacturing the semiconductor device.

According to one aspect of the present invention, for achieving the above object, there is provided a semiconductor device, comprising an insulated board, and device regions each formed in a region etched such that a side face thereof becomes substantially normal to the surface of the insulated board. Here, the insulated board can make use of a sapphire substrate, and the device regions may preferably be formed of monocrystal silicon.

Since a silicon layer corresponding to each of the device regions (active regions) is formed in each of the regions obtained by etching the sapphire substrate corresponding to the insulated board, each device-to-device isolation region results in the sapphire substrate per se used as the insulator. Thus, the sapphire substrate is vertically etched so that the end of the device region can also be formed normal to the sapphire substrate.

According to another aspect of the present invention, for forming the semiconductor device using a sapphire substrate, there is provided a method of manufacturing the semiconductor device, comprising the steps of patterning spots corresponding to device regions of the sapphire substrate by use of a photoresist and anisotropically etching the spots such that their side faces become substantially normal to the surface of the sapphire substrate, forming a silicon layer over the whole surface of the sapphire substrate so as to become thicker than an etching depth of the sapphire substrate in the previous step, implanting silicon ions into the formed silicon layer to thereby amorphize the silicon layer, performing annealing to thereby recrystallize the amorphized silicon layer, and planarizing the recrystallized silicon layer until the sapphire substrate is exposed, thereby to leave the silicon layer used as the device regions at the etched spots of the sapphire substrate.

Since the silicon layer embedded and formed in the etched regions serve as the device regions, the etching depth of the sapphire substrate may preferably be formed in substantially the same manner as the desired thickness of each device region.

After the planarization of the silicon layer, a step for annealing the sapphire substrate and thereby forming thermal oxide films, and a step for removing the thermal oxide films can also be further added. Although a defective condition like a leak current developed between the devices occurs where residuals of the silicon layer in the planarizing step exist on the sapphire substrate that serve as each device-to-device isolation region, the formation and removal of the thermal oxide film enables prevention of silicon from remaining on the sapphire substrate.

With the formation and removal of the thermal oxide film, the surface of the silicon layer corresponding to each device region is formed at a position lower than the surface of the sapphire substrate that serves as the device-to-device isolation regions. However, no problem arises in terms of the device formation. It is preferable to form the silicon layer in consideration of a decrease in the thickness thereof due to etching. In order to bring silicon remaining on the sapphire substrate to the thermal oxide film and remove it, thermal oxidation may preferably be done in such a manner that the thickness of the thermal oxide film formed on the silicon layer reaches a thickness equivalent to approximately $1/100$ to $1/2$ times the thickness of the silicon layer.

According to the present invention as described above in detail, a semiconductor device using a sapphire substrate used as an insulated board can be brought to a structure wherein etching is done such that the side faces of regions corresponding to active regions of the sapphire substrate become substantially vertical, and a silicon layer is formed in the regions, whereby device isolation regions results in the sapphire substrate itself and the ends of active regions take shapes each normal to the surface of the sapphire substrate. Therefore, no parasitic transistors are formed and a defective condition like a leak current such as hump characteristics can be eliminated. It is also possible to narrow a device-to-device interval and miniaturize or scale down the semiconductor device.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 is a process cross-sectional view showing a semiconductor device according to a first embodiment of the present invention, wherein

FIG. 2 is a cross-sectional view illustrating the semiconductor device according to the first embodiment, wherein

FIG. 3 is a process cross-sectional view showing a semiconductor device according to a second embodiment of the present invention, wherein

DETAILED DESCRIPTION OF THE INVENTION

Figure 1A:
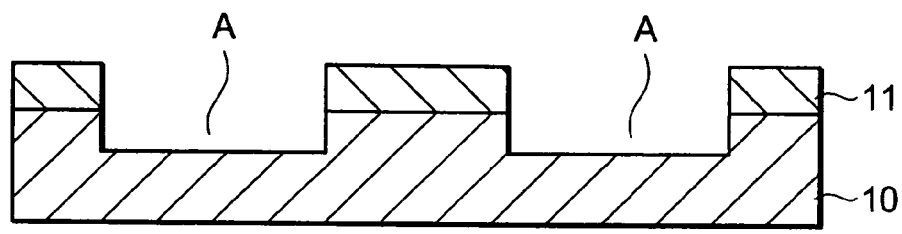
FIG. 1(a) is a view subsequent to etching of a sapphire after a photoresist has been patterned.
Figure 1B:
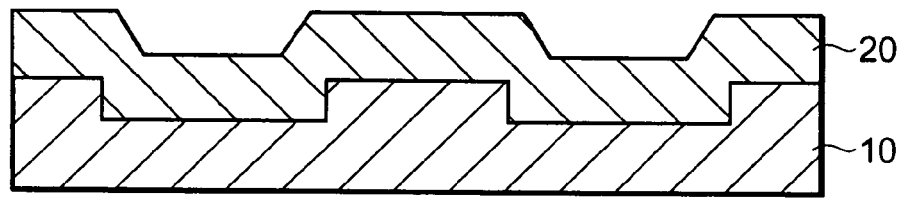
FIG. 1(b) is a view subsequent to deposition of Si.

Preferred embodiments of the present invention will hereinafter be described in detail with reference to the accompanying drawings. Incidentally, elements of structure each having substantially the same functional constitution are respectively identified by the same reference numerals in the present specification and the drawings, and the description of certain common elements of structure will therefore be omitted.

<First Embodiment>

A semiconductor device according to a first embodiment will be described with reference to a process cross-sectional view of FIG. 1. Regions corresponding to device regions (active regions) A, of a sapphire substrate 10 corresponding to an insulated board are first patterned by a photoresist 11 using photolithography so as to be opened. Anisotropic etching is next performed by a plasma etching method using, for example, a fluorine (F) or chlorine (Cl) etching gas to etch a sapphire in such a manner that the side face of each region reaches a predetermined depth, e.g., a range from approximately 30 to 500 nm and becomes substantially normal to the surface of the sapphire (see FIG. 1(a)). As a method for the anisotropic etching, an ion sputtering method or the like may be adopted.

After the removal of the photoresist 11, wet cleaning is first performed using, for example, hydrochloric acid (HCl) to remove a damage layer disordered in crystal structure due to plasma or the like in an etching region. Thereafter, a silicon (Si) layer 20 is formed thicker than the etching depth of the sapphire substrate 10 by a CVD method (see FIG. 1(b)). The reason why the Si layer 20 is formed thicker than the etching depth of the sapphire substrate 10 is that the sapphire substrate 10 is planarized till its exposure in a subsequent process to leave the Si layer embedded in the whole etching region.

Figure 1C:
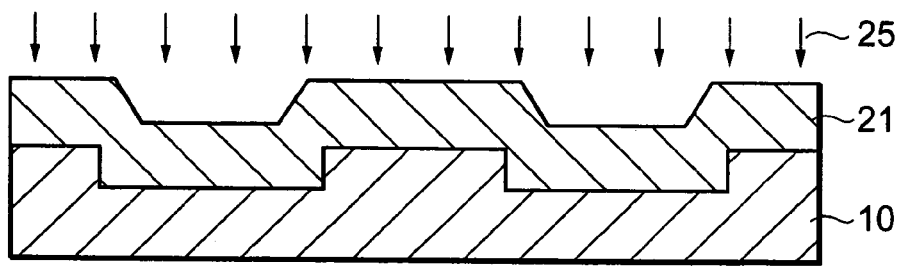
FIG. 1(c) is a view after anneal has been performed to recrystallize an Si layer.
Figure 1D:
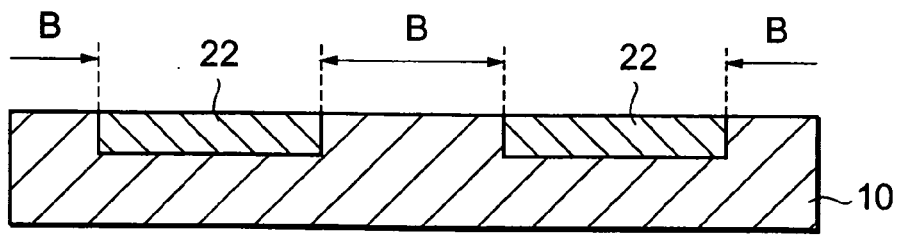
FIG. 1(d) is a view subsequent to planarization of the Si layer.

Then, $Si^+$ ions 25 are ion-implanted in a manner similar to the conventional method to form an amorphized Si layer 21 (see FIG. 1(c)). Thereafter, anneal is performed at a high temperature to recrystallize the Si layer 21, thereby forming a good-quality Si layer 22 less reduced in crystal defect. Then, the Si layer 22 is planarized using a CMP (Chemical Mechanical Polishing) method until the surface of the sapphire substrate 10 is exposed (see FIG. 1(d)), whereby a semiconductor device is formed in which only each of the active regions has an Si monocrystal layer and device-to-device isolation regions B are respectively of the sapphire of the substrate per se. Since the thickness of the Si layer 22 in each active region is determined according to the etching depth of the sapphire substrate, the sapphire substrate is etched to a desired depth corresponding to a design value upon etching.

An elemental device is formed in each active region formed in this manner according to the normal device process. Silicon layers 22, which respectively serve as device regions, are formed on the sapphire substrate 10. A gate oxide film 30 of a field effect transistor, a gate 40 thereof and contacts 50 for its source and drain are formed over the corresponding silicon layer 22. Further, the devices (silicon layers 22) adjacent to one another are isolated from one another by the sapphire substrate 10.

Figure 2A:
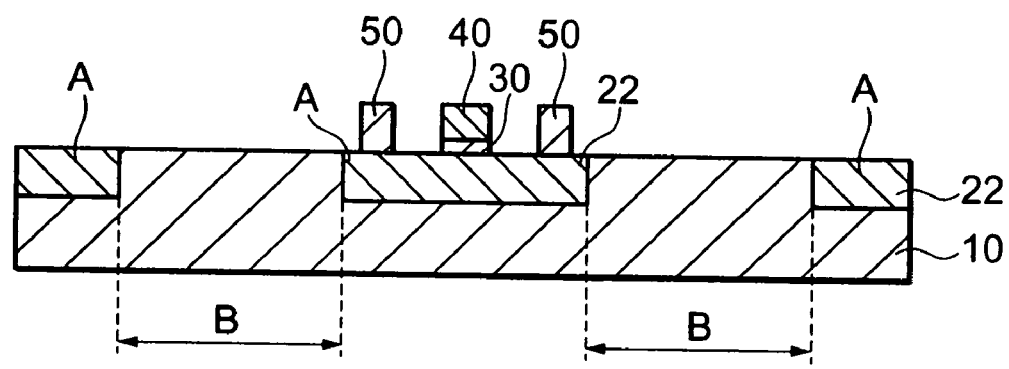
FIG. 2(a) is a cross-sectional view thereof as viewed in the direction normal to a gate.
Figure 2B:
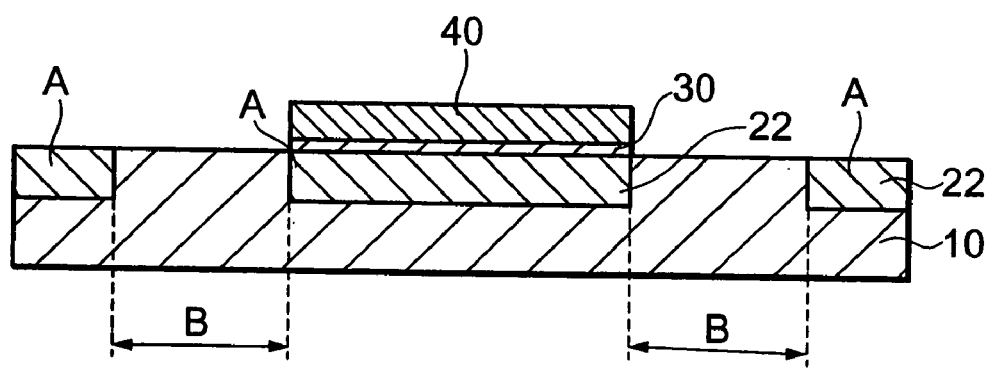
FIG. 2(b) is a cross-sectional view thereof as viewed in the direction parallel to the gate.

A schematic device cross-sectional view as seen in the direction normal to the gate is shown in FIG. 2(a), and a schematic device cross-sectional view as seen in the direction parallel to the gate is shown in FIG. 2(b). Thus, the sapphire ($Al_2O_3$) per se of the original sapphire substrate serves as an insulating film for isolating between elemental devices. Each of the device-to-device isolation regions B of $Al_2O_3$ is not brought to a bird's beak shape like a LOCOS oxide film, and the end of each of active regions A can be brought to a shape normal to the substrate surface.

That is, since the shape of the active region is not pointed and no parasitic transistor is formed in the present embodiment, the present embodiment is brought to a structure wherein a defective condition like a leak current such as a hump can be eradicated or eliminated. It is understood that since the end of the active region takes the shape normal to the substrate surface, the present embodiment is brought to a structure capable of narrowing the interval between the devices and suitable for miniaturization.

<Second Embodiment>

Figure 3A:
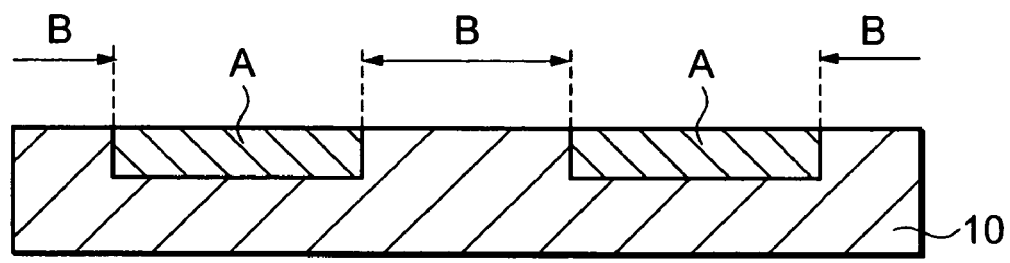
FIG. 3(a) is a view after an Si layer has been recrystallized and planarized.
Figure 3B:
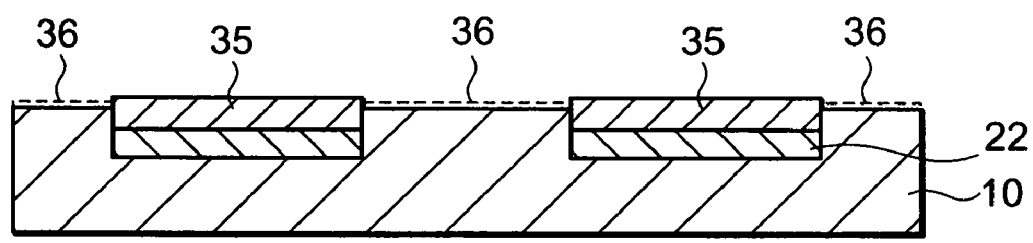
FIG. 3(b) is a view subsequent to the formation of thermal oxide films over a substrate surface.
Figure 3C:
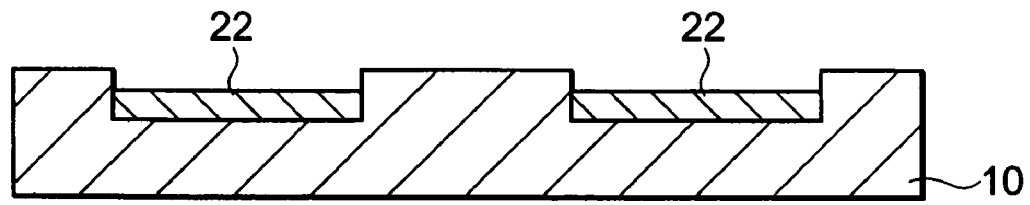
FIG. 3(c) is a view subsequent to the removal of the thermal oxide films.
Figure 4:
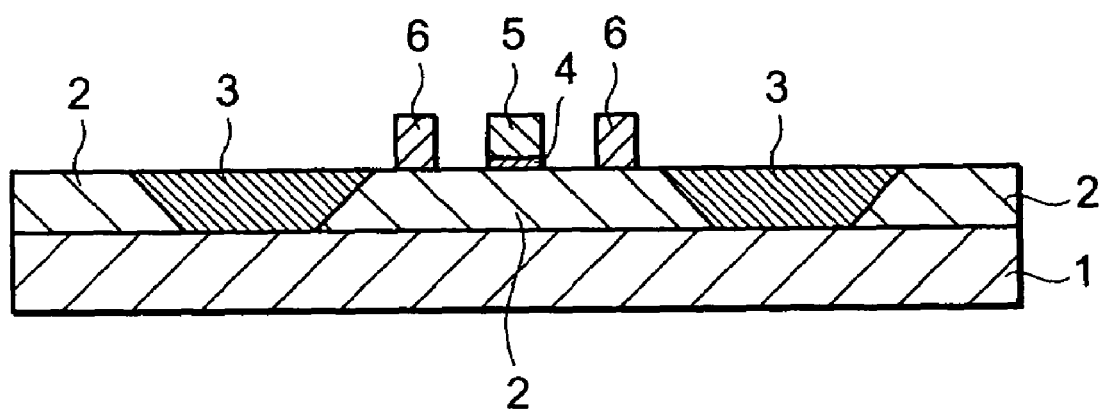
FIG. 4 is a schematic cross-sectional view illustrating a semiconductor device using a conventional sapphire substrate.

A semiconductor device according to a second embodiment of the present invention will be described with reference to a process cross-sectional view shown in FIG. 3. In a manner similar to the first embodiment, spots that serve as active regions, of a sapphire substrate 10, are patterned and thereafter anisotropically etched to thereby by-etching remove its sapphire up to a predetermined depth, e.g., a range from approximately 20 to 500 nm.

Further, damage layers lying in the etched regions are removed and an Si layer is deposited by a CVD method. Thereafter, Si$^+$ ions are implanted and the Si layer is amorphized. In addition, the Si layer is recrystallized by high-temperature anneal to form an Si layer 22. Then, the Si layer 22 is planarized so that a semiconductor device is formed wherein only the active regions A have Si monocrystal layers and device-to-device isolation regions B are respectively of the sapphire of the substrate per se (see FIG. 3(a)). The above process steps are done in a manner similar to the first embodiment.

Due to variations in the planarizing process, the Si layer 22 might be left over the sapphire corresponding to each device-to-device isolation region B other than the active regions A. Although it is of course desirable to manufacture the semiconductor device such that no Si remains in the device-to-device isolation regions, the Si layer 22 provided on each active region A and the residual Si (not shown) provided on the device-to-device isolation regions B are thermally oxidized at about 1000° C., for example to form thermal oxide films 35 and 36 in order to resolve the possibility of the occurrence of its defective condition, as shown in FIG. 3(b). Since this aims to oxidize Si where Si remains in the device-to-device isolation regions B, it is desirable that the thermal oxide film 35 having a thickness equal to approximately 1/100 to 1/2 times the thickness of the Si layer 22 of each active region A is formed by thermal oxidation.

Thereafter, the thermal oxide films 35 and 36 are removed by etching using hydrofluoric acid (HF) or the like. This is shown in FIG. 3(b). Thus, Si remaining on the sapphire of each device-to-device isolation region B is perfectly removed. While the surface of each active region A is being placed in a position lowered by the removed thermal oxide film from the surface of the device-to-device isolation region B, an elemental device is formed in the active region by the conventional method. It is necessary to form the thickness of the Si layer on the active region in consideration of its thermal oxidation and etching.

Since the shape of the active region A is not pointed and no parasitic transistor is formed in a manner similar to the first embodiment, the device formed by the present embodiment as described above can be brought to a structure capable of eliminating a defective condition like hump characteristics and suitable for miniaturization. Further, although a problem arises in that the Si layer remains on the device-to-device isolation insulating film, Si left as the residuals can be eliminated even in such a case. It is, therefore, possible to perfectly eliminate a leak between the adjacent active regions.

Although the preferred embodiments of the present invention have been described above with reference to the accompanying drawings, it is needless to say that the present invention is not limited to such embodiments. It will be apparent to those skilled in the art that various changes and modifications can be supposed to be made to the invention within the scope described in the claims. It should be understood that those changes and modifications fall within the technical scope of the present invention.

The present invention is applicable to a semiconductor device using an insulated board. The present invention is applicable particularly to a semiconductor device which is capable of resolving a defective condition such as a leak current between devices formed on a silicon layer placed on a sapphire substrate and which is suitable for its miniaturization, and a method of manufacturing the semiconductor device.

What is claimed is:

1. A semiconductor device, comprising:
   a sapphire substrate;
   silicon regions each formed into an etched area on an exposed surface of the sapphire substrate, whereby sapphire isolation regions surround each of the silicon regions and electrically isolate the silicon device regions from each other, and wherein side faces of the silicon regions are substantially normal to the exposed surface of the sapphire substrate; and
   active devices formed on exposed outer surfaces of the silicon regions adjacent to the exposed surface of the sapphire substrate.

2. The semiconductor device according to claim 1, wherein the exposed outer surface of each of the silicon regions is recessed below the exposed surface of the sapphire substrate.

3. A method of manufacturing a semiconductor device using a sapphire substrate, comprising the following steps of:
   selectively etching regions corresponding to device regions of the sapphire substrate such that their side faces are substantially vertical;
   forming a silicon layer over the whole surface of the sapphire substrate so as to become thicker than an etching depth of the sapphire substrate;
   implanting silicon ions into the silicon layer to amorphize the silicon layer;
   performing annealing to thereby recrystallize the amorphized silicon layer; and
   planarizing the recrystallized silicon layer until the sapphire substrate is exposed, thereby to leave the silicon layer in the etching regions of the sapphire substrate.

4. The method according to claim 3, wherein the depth of etching of the sapphire substrate is formed in substantially the same manner as a desired thickness of said each device region.

5. The method according to claim 3, further comprising steps of, after the planarization of the recrystallized silicon layer:
   annealing the sapphire substrate and forming thermal oxide films on the silicon layer and the sapphire substrate on which residuals of the silicon layer exist; and
   removing the thermal oxide films.

6. The method according to claim 5, wherein the thickness of the thermal oxide film on the silicon layer is a thickness equivalent to approximately 1/100 to 1/2 times the thickness of the planarized silicon layer.

* * * * *